(12) United States Patent
Chen et al.

(10) Patent No.: US 11,430,532 B2
(45) Date of Patent: Aug. 30, 2022

(54) GATE DRIVING CIRCUIT

(71) Applicant: AU Optronics Corporation, Hsin-Chu (TW)

(72) Inventors: Yu-Jen Chen, Hsin-Chu (TW); Meng-Chieh Tsai, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 49 days.

(21) Appl. No.: 17/094,849

(22) Filed: Nov. 11, 2020

(65) Prior Publication Data

US 2021/0248944 A1 Aug. 12, 2021

(30) Foreign Application Priority Data

Feb. 6, 2020 (TW) .................................. 109103772

(51) Int. Cl.
*G11C 19/28* (2006.01)
*G09G 3/3266* (2016.01)
*G09G 3/36* (2006.01)
*G09G 3/20* (2006.01)

(52) U.S. Cl.
CPC ......... *G11C 19/287* (2013.01); *G09G 3/3266* (2013.01); *G09G 3/3674* (2013.01); *G09G 3/20* (2013.01); *G09G 2310/0267* (2013.01); *G09G 2310/0286* (2013.01); *G09G 2310/08* (2013.01)

(58) Field of Classification Search
CPC .... G11C 19/287; G11C 19/27; G09G 3/3266; G09G 3/3674; G09G 3/20; G09G 2310/0202; G09G 2310/0286; G09G 2310/08; G09G 2310/0267
See application file for complete search history.

(56) References Cited

U.S. PATENT DOCUMENTS

| | | | |
|---|---|---|---|
| 7,573,972 B2 | 8/2009 | Chen | |
| 7,756,238 B2 | 7/2010 | Chen | |
| 2012/0008731 A1* | 1/2012 | Hsu | G11C 19/28 377/79 |
| 2012/0235890 A1 | 9/2012 | Hsu et al. | |
| 2013/0077736 A1 | 3/2013 | Son | |
| 2015/0294734 A1 | 10/2015 | Chan | |

FOREIGN PATENT DOCUMENTS

| | | |
|---|---|---|
| CN | 101976580 A | 2/2011 |
| CN | 104112421 A | 10/2014 |
| CN | 107633816 A | 1/2018 |

\* cited by examiner

*Primary Examiner* — Julie Anne Watko
(74) *Attorney, Agent, or Firm* — WPAT, PC

(57) ABSTRACT

A gate driving circuit includes a plurality of shift registers coupled in series. An nth shift register includes a driving circuit and a pull-down circuit. The driving circuit is electrically coupled to an output node and a first node. The driving circuit is configured to receive a first clock signal and output a gate signal according to the first clock signal. The pull-down circuit is electrically coupled to the output node. The pull-down circuit is configured to receive an (n−m)th gate signal and an (n+m)th gate signal, and pull-down the gate signal to a low voltage level according to one of the (n−m)th gate signal and the (n+m)th gate signal, wherein m and n are positive integers.

10 Claims, 5 Drawing Sheets

GATE DRIVING CIRCUIT

CROSS-REFERENCE TO RELATED APPLICATION

This application claims priority to Taiwan Application Serial Number 109103772, filed Feb. 6, 2020, which is herein incorporated by reference in its entirety.

BACKGROUND

Field of Invention

The present invention relates a gate driving circuit. More particularly, the present invention relates to a gate driving circuit for forward and reverse scanning.

Description of Related Art

Generally, a gate driving circuit in a display device is formed by shift registers coupled in series, and each of the shift registers is configured to output a gate driving signal. The gate driving signal turns on a corresponding pixel row, such that display data can be written into pixels on the corresponding pixel row.

Under traditional shift register architecture, the gate driving circuit provides the gate driving signal, and pulses of the gate driving signal vary from a high level to a low level within falling time periods. However, if the falling time periods of the pulses take too long, the pixel driven by the gate driving signals can be written with incorrect voltage levels. Therefore, it is desired to shorten the falling time periods of the gate driving signals.

SUMMARY

An embodiment of the present disclosure provides a gate driving circuit. The gate driving circuit includes a plurality of shift registers coupled in series. An nth shift register of the shift registers includes a driving circuit and a pull-down circuit. The driving circuit is electrically coupled to an output terminal and a first node. The driving circuit is configured to receive a first clock signal and is configured to output the gate signal according to the first clock signal. The pull-down circuit is electrically coupled to the output terminal. The pull-down circuit is configured to receive a (n−m)th gate signal and a (n+m)th gate signal, and is configured to pull-down the gate signal to the low voltage level according to one of the (n−m)th gate signal and the (n+m)th gate signal, wherein m and n are positive integers.

The gate driving circuit of the present disclosure mainly utilizes the (n−m)th gate signal and the (n+m)th gate signal to speed up the discharging of the output terminal of the nth shift register to low voltage level, such that a falling time period of the gate signal provided by the shift register can be reduced.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
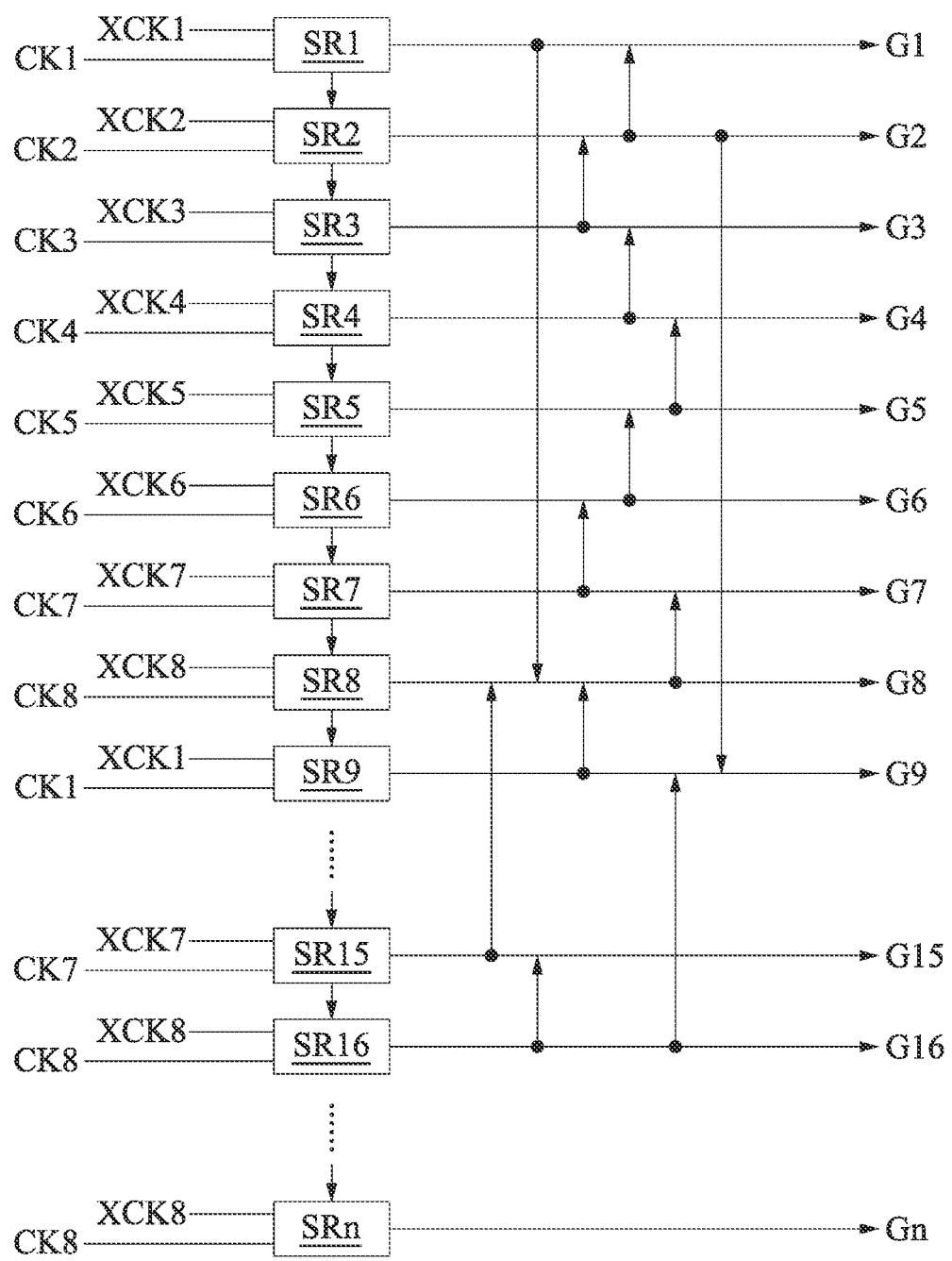
FIG. 1 is a circuit block diagram of a gate driving circuit according to an embodiment of the present disclosure.

Reference will now be made in detail to the present embodiments of the invention, examples of which are illustrated in the accompanying drawings. Wherever possible, the same reference numbers are used in the drawings and the description to refer to the same or like parts.

The reference is made to FIG. 1. FIG. 1 is a circuit block diagram of a gate driving circuit 100 according to an embodiment of the present disclosure. As shown in FIG. 1, the gate driving circuit 100 includes a plurality of shift registers SR1~SRn coupled in series. Each of the shift registers SR1~SRn outputs corresponding one gate signal of the gate signals G1~Gn, respectively. And, each of the shift registers SR1~SRn is configured to receive clock signals CK and XCK, respectively. As shown in FIG. 1, nth shift register of the shift registers SR1~SRn is configured to receive clock signals CK1~CK8 and clock signals XCK1~XCK8, and is configured to receive (n−1)th gate signal G(n−1), (n+1)th gate signal G(n+1), (n−m)th gate signal G(n−m) and (n+m)th gate signal G(n+m). In some embodiments, m can correspond to a horizontal scanning period of the gate signal.

As mentioned above, for example, the 1st shift register is configured to receive clock signal CK1 and XCK1, the 2nd shift register is configured to receive clock signal CK2 and XCK2, and so forth. It is noted that, the 9th shift register is configured to receive clock signal CK1 and XCK1, and therefore the shift registers illustrated in the embodiment of the present disclosure includes eight consecutive stages in one cycle for demonstrations. However, the scope of present disclosure should not be limited thereto.

Figure 2:
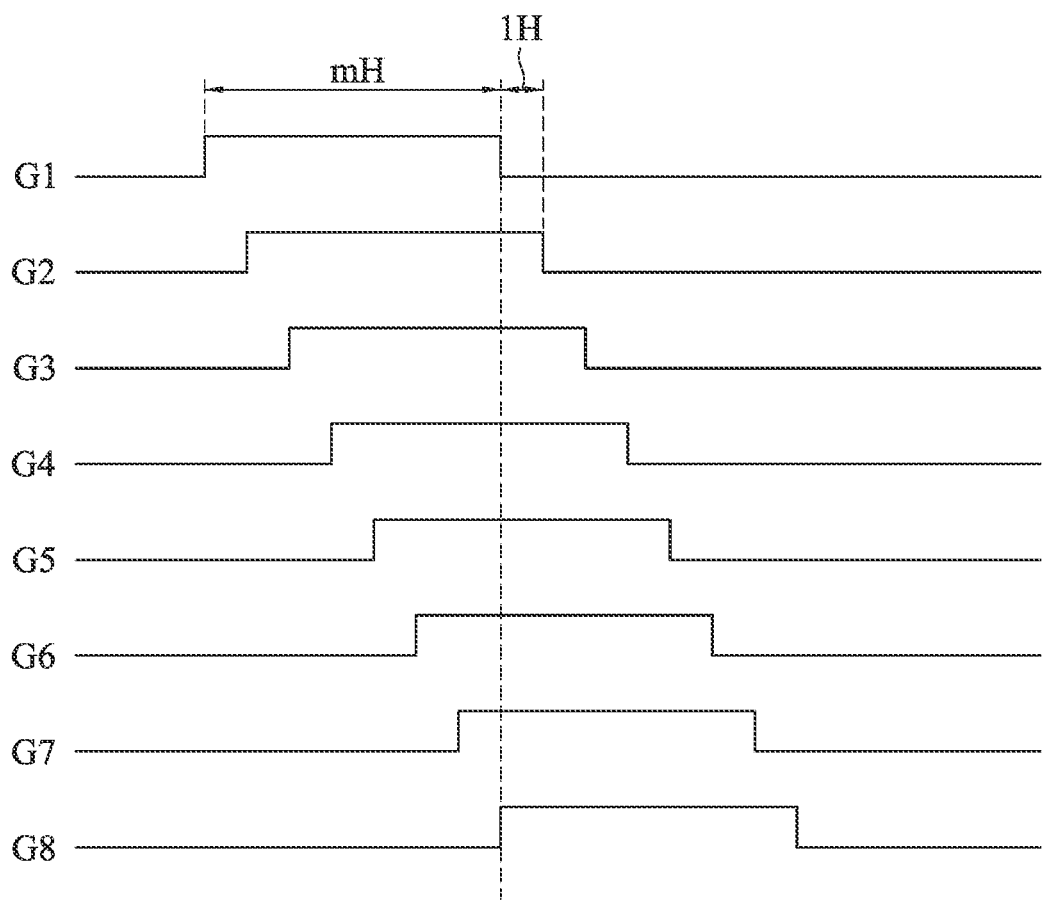
FIG. 2 is a timing diagram of a gate signal according to an embodiment of the present disclosure.

The reference is made to FIG. 2. FIG. 2 is a timing diagram of gate signals according to an embodiment of the present disclosure. As shown in FIG. 2. In order to provide enough time for pre-charging the pixels, the enable time periods of the gate signals are prolonged. In the embodiment, m amount of horizontal scanning periods mH are allocated to pixels in one row. Furthermore, a time difference between the 1st gate signal G1 and the 2nd gate signal G2 is equal to 1 horizontal scanning period 1H. The 1st gate signal G1 is turned off at the same time point as the 8th gate signal G8 is turned on. Therefore, in the embodiment shown in the FIG. 2, m horizontal scanning period mH can be implemented as 7 horizontal scanning periods (7H). It is noted that, the m amount of horizontal scanning periods mH can be implemented by other amount of horizontal scanning periods. The scope of present disclosure should not be limited thereto.

Reference is further made to FIG. 1, the 8th shift register (n=8) is taken for an example. The 8th shift register is configured to receive the clock signal CK and XCK, the 7th gate signal G7, the 9th gate signal G9, the 1th gate signal G1 and the 15th gate signal G15. Each one of the shift registers is configured to receive a gate signal from the previous stage, another gate signal from the next stage, another gate signal from the previous 7th stage and another gate signal from the next 7th stage.

Figure 3:
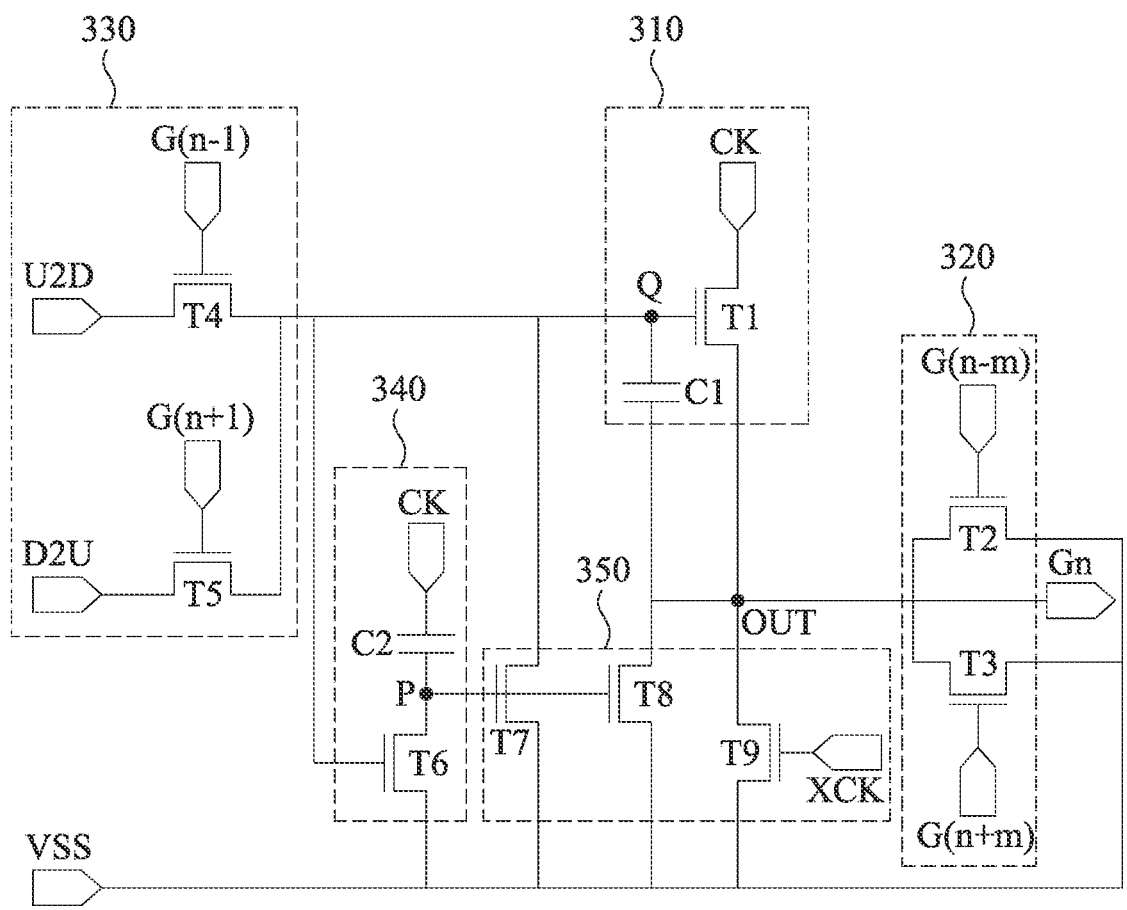
FIG. 3 is a circuit diagram of a shift register according to an embodiment of the present disclosure.

Reference is further made to FIG. 3. FIG. 3 is a circuit diagram of a shift register 300 according to an embodiment of the present disclosure. As shown in FIG. 3, the shift register 300 includes a driving circuit 310, a pull-down circuit 320, a pull-up circuit 330, a regulator control circuit 340 and a regulator circuit 350. The driving circuit 310 is electrically coupled to an output terminal OUT and a node Q. The pull-down circuit 320 is electrically coupled to the output terminal OUT. The pull-up circuit 330 and the regulator control circuit 340 are electrically coupled to the node Q. The regulator circuit 350 is electrically coupled to the regulator control circuit 340, the node Q and the output terminal OUT.

As mentioned above, the driving circuit 310 is configured to receive the clock signal CK and is configured to output the gate signal Gn according to the clock signal CK. In this embodiment, the 8th shift register (n=8) is taken as an example, and therefore the driving circuit 310 is configured to output the 8th gate signal G8 according the clock signal CK. The driving circuit 310 includes a transistor T1 and a capacitance C1. A first terminal of the transistor T1 is configured to receive the clock signal CK. A second terminal of the transistor T1 is electrically coupled to the output terminal OUT. A control terminal of the transistor T1 is electrically coupled to the node Q. A first terminal of the capacitance C1 is electrically coupled to the node Q. A second terminal of the capacitance C1 is electrically coupled to the output terminal OUT.

As mentioned above, the pull-down circuit 320 is configured to receive the (n−m)th gate signal G(n−m) and the (n+m)th gate signal G(n+m). And, the pull-down circuit 320 is configured to pull down the gate signal Gn to the low voltage VSS according to one of the (n−m)th gate signal G(n−m) and the (n+m)th gate signal G(n+m). The pull-down circuit 320 includes a transistor T2 and a transistor T3. A first terminal of the transistor T2 is electrically coupled to the output terminal OUT. A second terminal of the transistor T2 is electrically coupled to the low voltage VSS. A control terminal of the transistor T2 is configured to receive the (n−m)th gate signal G(n−m). A first terminal of the transistor T3 is electrically coupled to the output terminal OUT. A second terminal of the transistor T3 is electrically coupled to the second terminal of the transistor T2. A control terminal of the transistor T3 is configured to receive the (n+m)th gate signal G(n+m). In this embodiment, the control terminal of the transistor T2 is configured to receive the 1th gate signal G1. And, the first terminal of the transistor T3 is configured to receive the 15th gate signal G15.

As mentioned above, the pull-up circuit 330 is configured to receive a first select signal U2D, a second select signal D2U, the (n−1)th gate signal G(n−1) and the (n+1)th gate signal G(n+1). The pull-up circuit 330 is configured to pull up a nth voltage signal Q(n) of the node Q to the high level. The pull-up circuit 330 includes a transistor T4 and a transistor T5. A first terminal of the transistor T4 is configured to receive the first select signal U2D. A second terminal of the transistor T4 is electrically coupled to the node Q. A control terminal of the transistor T4 is configured to receive the (n−1)th gate signal G(n−1). A first terminal of the transistor T5 is configured to receive the second select signal D2U. A second terminal of the transistor T5 is electrically coupled to the second terminal of the transistor T4. A control terminal of the transistor T5 is configured to receive the (n+1)th gate signal G(n+1). In this embodiment, the control terminal of the transistor T4 is configured to receive the 7th gate signal G7. And, the first terminal of the transistor T5 is configured to receive the 9th gate signal G9.

As mentioned above, the regulator control circuit 340 is configured to receive the clock signal CK and the nth voltage signal Q(n) of the node Q. And the regulator control circuit 340 is configured to control the regulator circuit 350. The regulator control circuit 340 includes a transistor T6 and a capacitance C2. A first terminal of the capacitance C2 is configured to receive the clock signal CK. A second terminal of the capacitance C2 is electrically coupled to a node P. A first terminal of the transistor T6 is electrically coupled to the node P. A second terminal of the transistor T6 is electrically coupled to the low voltage VSS. A control terminal of the transistor T6 is electrically coupled to the node Q. And, the control terminal of the transistor T6 is configured to receive the nth voltage signal Q(n) of the node Q.

As mentioned above, the regulator circuit 350 is configured to receive a voltage signal P(n) of the node P and the clock signal XCK. And, the regulator circuit 350 is configured to maintain the transistor T1 at a level of the low voltage VSS according to the clock signal XCK. The regulator circuit 350 includes a transistor T7, a transistor T8 and a transistor T9. A first terminal of the transistor T7 is electrically coupled to the node Q. A second terminal of the transistor T7 is electrically coupled to the low voltage VSS. A control terminal of the transistor T7 is electrically coupled to the node P, and the control terminal of the transistor T7 is configured to receive the nth voltage signal P(n) of the node P. A first terminal of the transistor T8 is electrically coupled to the second terminal of the capacitance C1. A second terminal of the transistor T8 is electrically coupled to the low voltage VSS. A control terminal of the transistor T8 is electrically coupled to the node P, and the control terminal of the transistor T8 is configured to receive the nth voltage signal P(n) of the node P. A first terminal of the transistor T9 is electrically coupled to the output terminal OUT. A second terminal of the transistor T9 is electrically coupled to the low voltage VSS. A control terminal of the transistor T9 is configured to receive the clock signal XCK.

In some practices, aforesaid transistors of the disclosure can be implemented by the P-type low temperature polysilicon thin film transistor, but the scope of present disclosure should not be limited thereto. For example, aforesaid transistors of the present disclosure can be implemented by the P-type amorphous silicon thin film transistor or the other type of thin film transistor.

It is noted that, aforesaid pull-down circuit 320 of the disclosure can be utilized in a shift register different from the embodiment shown in FIG. 3. The structure shown in FIG. 3 with seven transistors and two capacitors (7T2C) are demonstrated as an example. However, the scope of present disclosure should not be limited thereto.

Figure 4:
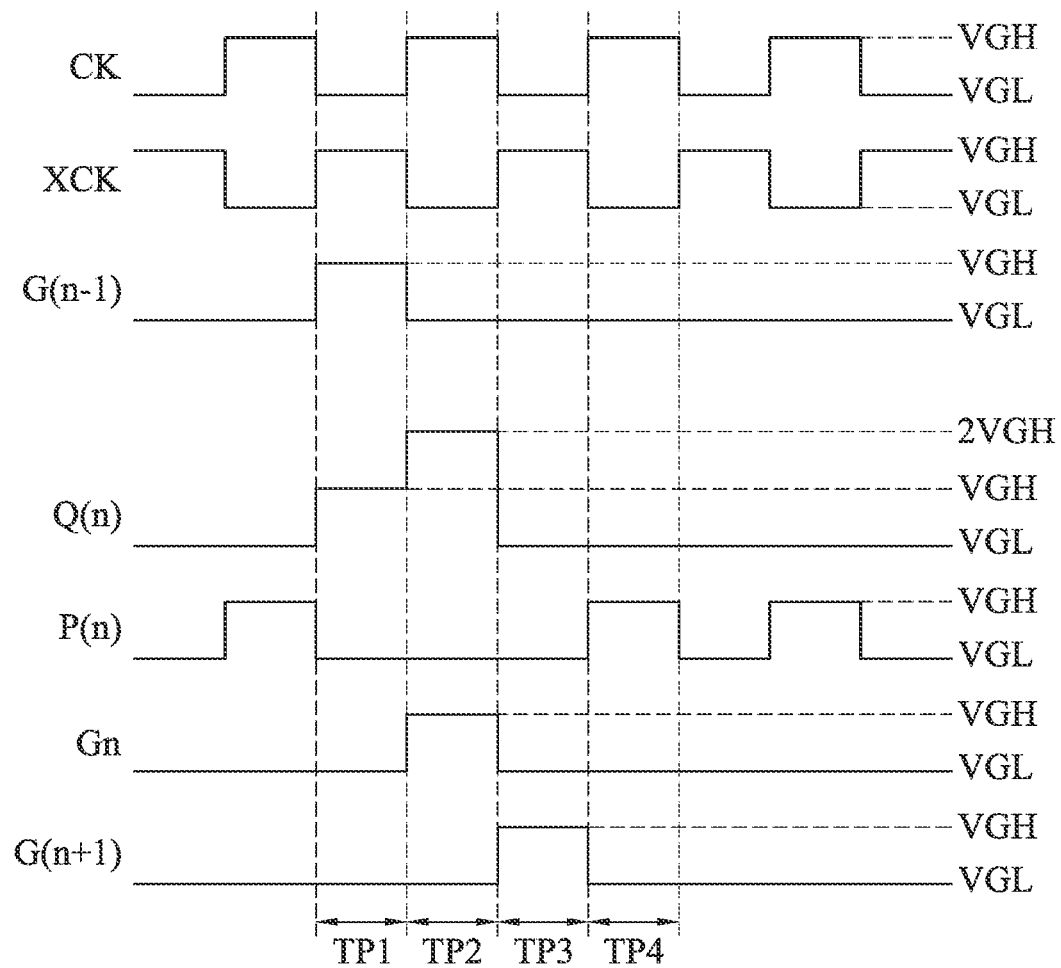
FIG. 4 is an operating timing diagram of a shift register according to an embodiment of the present disclosure.

An operation manner of the shift register 300 is further discussed with FIG. 2 and FIG. 4 in following sections. FIG. 4 is an operating timing diagram of a shift register 300 according to an embodiment of the present disclosure. In an example that the shift register 300 operates with a forward scanning order (i.e., up to down), the first select signal U2D is configured at a high gate voltage VGH and the second select signal D2U is configured at a low gate voltage VGL. As shown in FIG. 4, in a period TP1, the (n−1)th gate signal G(n−1) is at the high gate voltage VGH, such that the transistor T4 is switched on. A voltage level of the node Q is pull up to the high voltage VGH. Meanwhile, the transistor T1 and the transistor T6 are switched on because of the voltage of the node Q at the high gate voltage VGH. The transistor T9 is switched on because of the clock signal XCK at the high gate voltage VGH. However, because of the clock signal CK is at the gate low signal VGL, voltage of the gate signal Gn and voltage of the node P are maintained at a low voltage VGL, thus the transistor T7 and the transistor T8 are switched off.

Next, in a period TP2, the (n−1)th gate signal G(n−1) is pull down to the low gate voltage VGL. The clock signal CK is at the high gate voltage VGH. And, the clock signal XCK is at the low gate voltage VGL. Meanwhile, the transistor T4 and the transistor T5 are switched off, and the transistor T1 is switched on, therefore the gate signal Gn is pull up to the high gate voltage VGH. Meanwhile, the nth voltage signal Q(n) is pull up to about twice as high as the high gate voltage VGH because of coupling effect. Meanwhile, the transistor T6 is switched on.

Next, in a period TP3, the (n+1)th gate signal G(n+1) and the clock signal XCK are at the high gate voltage VGH, such that the transistor T5 and the transistor T6 are switched on. Meanwhile, the nth voltage signal Q(n) of the node Q is pull down to a voltage level which is similar as the second select signal D2U (that is, the low gate voltage VGL) since the transistor T5 is switched on. And, the gate signal Gn is pull down to the low voltage VSS since the transistor T9 is switched on, and since the nth voltage signal Q(n) of the node Q is pull down to the low gate voltage VGL, the transistor T1 and the transistor T6 are switched off.

Next, in a period TP4, since the clock signal CK changes to the high gate voltage VGH, such that the nth voltage signal P(n) of the node P is pull up to the high gate voltage VGH. And then, the transistor T7 and the transistor T8 are switched on, such that the nth voltage of the node Q and the voltage of the output terminal OUT are maintained at the low voltage VSS.

Figure 5:
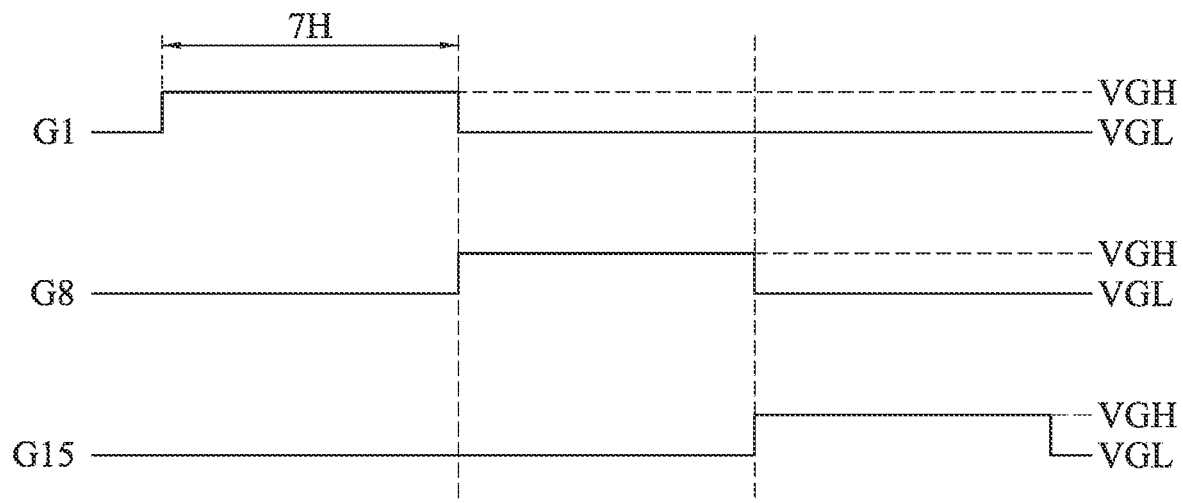
FIG. 5 is a timing diagram of some gate signals according to an embodiment of the present disclosure.

Reference is made to FIG. 5. FIG. 5 is a timing diagram of some gate signals G1, G8 and G15 according to an embodiment of the disclosure. The timing diagram shown in FIG. 4 is the timing diagram when the shift register 300 outputs the gate signal. However, in order to provide enough time for pre-charging the pixels, the gate signal is pulled high in advance for a certain time period. As shown in FIG. 5, the gate signal G1 is pulled high for total 7 horizontal scanning periods 7H. The gate signal Gn shown in FIG. 4 only illustrates the 7th horizontal scanning period. The gate signal Gn is also pulled high from the 1st horizontal scanning period to the 6th horizontal scanning period for pre-charging. The 8th gate signal G8 is taken as an example, when the 8th gate signal G8 is switched to the low gate voltage VGL, the 15th gate signal G15 is switched from the low gate voltage VGL to the high gate voltage VGH and turns on the transistor T3 in the 8th shift register 300 (referring to FIG. 3). Therefore, the transistor T3 in the 8th shift register 300 can cooperate with the transistor T9 to pull down the voltage of the output terminal OUT to the low voltage VSS to reduce the falling time of the 8th gate signal G8, because the output terminal OUT is pulled down by two discharging paths (one through the transistor T3 and another one through the transistor T9).

As the mentioned above, similarly, when the 1st shift register outputs the 1st gate signal G1, the 8th gate signal G8 turns on the pull-down circuit of the 1st shift register to reduce the falling time of the 1st gate signal G1.

Figure 6:
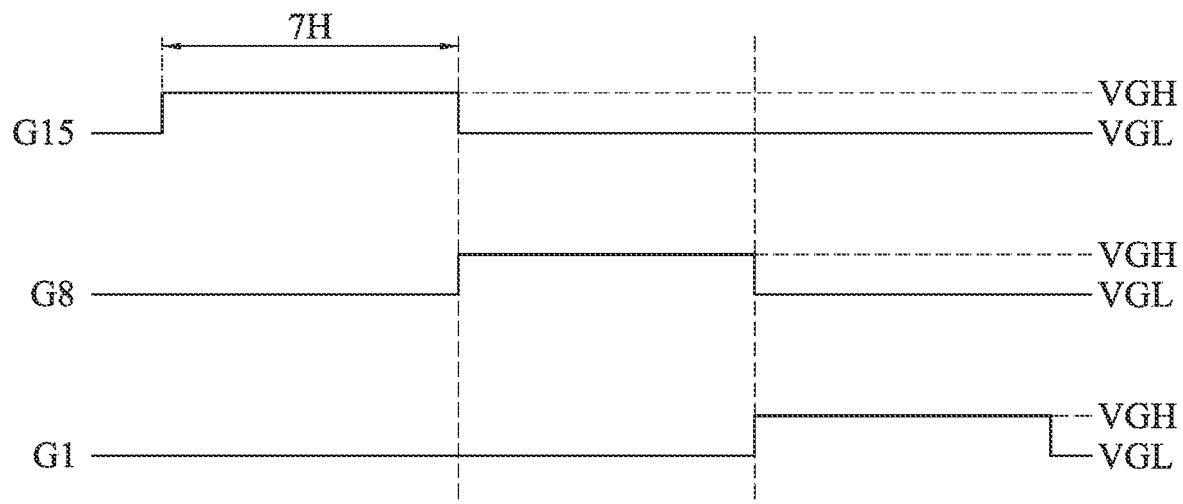
FIG. 6 is a timing diagram of some gate signals according to an embodiment of the present disclosure.

In another embodiment, reference is made to FIG. 6. FIG. 6 is a timing diagram of some gate signals G1, G8 and G15 according to an embodiment of the present disclosure. In an example that the shift register 300 operates with a reverse scanning order (i.e., down to up), the first select signal U2D is configured at the low gate voltage VGL and the second signal D2U is configured at the high gate voltage VGH. As shown in FIG. 6, the 8th gate signal G8 is taken for an example, when the 8th gate signal G8 is switched to the low gate voltage VGL, the 1th gate signal G1 turns on the transistor T2, and therefore the transistor T2 can cooperate with the transistor T9 to pull down the voltage of the output terminal OUT to the low voltage VSS to reduce the falling time of the 8th gate signal G8. Similarly, the 8th gate signal G8 turns on the pull-down circuit of the 15th shift register when the 15th shift register outputs the 15th gate signal G15 to reduce the falling time of the 15th gate signal G15.

It is noted that, the (n−m)th gate signal G(n−m) and the (n+m)th gate signal G(n+m) received by the pull-down circuit 320 are related to amount of horizontal scanning periods mH of the gate signal itself. The horizontal scanning period of the present disclosure is implemented as the 7 horizontal scanning periods (7H), and the 1st gate signal G1, the 8th gate signal G8, the 15th gate signal G15 are taken as an example, however, the scope of the disclosure should not be limited thereto.

Summary, the gate driving circuit of the present disclosure mainly utilizes the (n−m)th gate signal and the (n+m)th gate signal to speed up the discharging of the output terminal of the nth shift register to the low voltage level, such that the falling time period of the gate signal provided by the shift register during forward or reverse scanning can then be reduced.

Some words and phrases in the disclosure and the claim are utilized to indicate the specific element. However, people with common knowledge in the technical field may understand that the similarly element may use different nouns to indicate. The disclosure and the claim should distinguish the element based on the difference of the function of the element, instead of distinguishing the element in a manner according to the difference of nouns. In this document, the term "comprise" mentioned in the disclosure and claim is an open meaning language, such that the "comprise" should interpret as "comprise but not limit to". Additionally, in this document, the term "connect" includes any direct or indirect connection. Therefore, if the first element connect to the second element described in the disclosure represents that the first element may direct connect to the second element in a manner of the electrically connection or a manner of signal-coupled of wireless transmission, optical transmission, or the first element could be indirect or indirect connect to the second element by other element or manner.

Additionally, any singular terms may include plural means, singular means and simultaneously means, unless it is indicated in the disclosure.

Although the present invention has been described in considerable detail with reference to certain embodiments thereof, other embodiments are possible. Therefore, the spirit and scope of the appended claims should not be limited to the description of the embodiments contained herein.

What is claimed is:

1. A gate driving circuit, comprising a plurality of shift registers coupled in series, wherein an nth shift register of the shift registers comprises:
   a driving circuit, electrically coupled to a output terminal and a first node, wherein the driving circuit is configured to receive a first clock signal and is configured to output a nth gate signal according to the first clock signal; and
   a pull-down circuit, electrically coupled to the output terminal, wherein the pull-down circuit is configured to receive a (n−m)th gate signal and a (n+m)th gate signal, and is configured to pull down the said nth gate signal to a low voltage level according to one of the (n−m)th gate signal and the (n+m)th gate signal, wherein m and n are positive integers.

2. The gate driving circuit of claim 1, wherein the said nth shift register further comprises:
   a pull-up circuit, electrically coupled to the first node, wherein the pull-up circuit is configured to receive a first select signal, a second select signal, a (n−1)th gate signal and a (n+1)th gate signal, and is configured to pull up voltage of the first node to a high voltage level.

3. The gate driving circuit of claim 2, wherein the pull-up circuit further comprises:
   a fourth transistor, with a first terminal, a second terminal and a first control terminal, wherein the first terminal is configured to receive the first select signal, the second terminal is electrically coupled to the first node, and the first control terminal is configured to receive the (n−1)th gate signal; and
   a fifth transistor, with a third terminal, a fourth terminal and a second control terminal, wherein the third terminal is configured to receive the second select signal, the fourth terminal is electrically coupled to the first node, and the second control terminal is configured to receive the (n+1)th gate signal.

4. The gate driving circuit of claim 1, further comprising:
   a regulator circuit, electrically coupled to the driving circuit and a second node, wherein the regulator circuit is configured to receive voltage of the second node and a second clock signal, and is configured to maintain voltage of the first node in the low voltage according to voltage of the second node, and is configured to turn off the driving circuit according to the second clock signal.

5. The gate driving circuit of claim 4, further comprising:
   a regulator control circuit, electrically coupled to the regulator circuit and the first node, wherein the regulator control circuit is configured to receive the first clock signal, and is configured to control the regulator circuit according to the first clock signal.

6. The gate driving circuit of claim 5, wherein the regulator control circuit further comprises:
   a capacitor, with a first terminal and a second terminal, wherein the first terminal is configured to receive the first clock signal, and the second terminal is electrically coupled to the second node; and
   a sixth transistor, with a third terminal, a fourth terminal and a control terminal, wherein the third terminal is electrically coupled to the second node, the fourth terminal is configured to receive the low voltage level, and the control terminal is electrically coupled to the first node.

7. The gate driving circuit of claim 4, wherein the regulator circuit further comprises:
   a seventh transistor, with a first terminal, a second terminal and a first control terminal, wherein the first terminal is electrically coupled to the first node, the second terminal is configured to receive the low voltage level, and the first control terminal is electrically coupled to the second node;
   an eighth transistor, with a third terminal, a fourth terminal and a second control terminal, wherein the third terminal is electrically coupled to the driving circuit, the fourth terminal is configured to receive the low voltage level, and the second control terminal is electrically coupled to the second node; and
   a ninth transistor, with a fifth terminal, a sixth terminal and a third control terminal, wherein the fifth terminal is electrically coupled to the driving circuit, the sixth terminal is configured to receive the low voltage level, and the third control terminal is configured to receive the second clock signal.

8. The gate driving circuit of claim 1, wherein the driving circuit further comprising:
   a first transistor, with a first terminal, a second terminal and a control terminal, wherein the first terminal is configured to receive the first clock signal, the second terminal is electrically coupled to the output terminal, and the control terminal is electrically coupled to the first node; and
   a capacitor, with a third terminal and a fourth terminal, wherein the third terminal is electrically coupled to the first node, and the fourth terminal is electrically coupled to the output terminal.

9. The gate driving circuit of claim 1, wherein the pull-down circuit further comprises:
   a second transistor, with a first terminal, a second terminal and a first control terminal, wherein the first terminal is electrically coupled to the output terminal, and the first control terminal is configured to receive the (n−m)th gate signal; and
   a third transistor, with a third terminal, a fourth terminal and a second control terminal, wherein the third terminal is electrically coupled to the output terminal, the fourth terminal is electrically coupled to the second terminal, and the second control terminal is configured to receive the (n+m)th gate signal.

10. The gate driving circuit of claim 9, wherein when the (n−m)th gate signal turns on the second transistor, the second transistor is configured to pull down the gate signal to the low voltage level; and when the (n+m)th gate signal turns on the third transistor, the third transistor is configured to pull down the gate signal to the low voltage level.

* * * * *